June 2, 1970 M. E. HINES ET AL 3,516,014

TRANSISTOR OSCILLATOR WITH PASSIVE RESONATOR OUTPUT STAGE

Filed March 5, 1968 3 Sheets-Sheet 1

June 2, 1970 M. E. HINES ET AL 3,516,014

TRANSISTOR OSCILLATOR WITH PASSIVE RESONATOR OUTPUT STAGE

Filed March 5, 1968 3 Sheets-Sheet 2

June 2, 1970 M. E. HINES ET AL 3,516,014

TRANSISTOR OSCILLATOR WITH PASSIVE RESONATOR OUTPUT STAGE

Filed March 5, 1968 3 Sheets-Sheet 3

MARION E. HINES
JOHN GEORGE ONDRIA
INVENTORS

BY Alfred H. Rosen
ATTORNEY

United States Patent Office 3,516,014

Patented June 2, 1970

3,516,014

TRANSISTOR OSCILLATOR WITH PASSIVE RESONATOR OUTPUT STAGE

Marion E. Hines, Weston, Mass., and John George Ondria, Bethlehem, Pa., assignors to Microwave Associates, Inc., Burlington, Mass.

Filed Mar. 5, 1968, Ser. No. 710,499

Int. Cl. H03b 5/18

U.S. Cl. 331—96 18 Claims

ABSTRACT OF THE DISCLOSURE

A transistor oscillator in a common-collector circuit is coupled via its emitter to a passive resonator shunted by a coupling capacitor having capacitance substantially larger than the series-resonance capacitance of the resonator to provide a low-noise signal source.

BACKGROUND OF THE INVENTION

Stable low-noise electric wave generators in the microwave range (e.g.: 1 gHz. or higher), are available in the form of klystron oscillators, involving the use of vacuum tubes and their attendant power supplies and regulators. More recently, solid-state microwave generators have appeared, some in the form of an oscillator at low frequency (e.g.: at VHF or L-band), preferably crystal stabilized, followed by an amplifier, and then by a chain of several stages of harmonic generators such as circuits employing semiconductor diodes with non-linear capacitance (e.g.: varactors) for harmonic generation. Such solid state microwave generators, while successful successors to klystron generators for many applications, particularly where the microwave power requirements are not high, are complex and costly, and not readily tunable, and each stage introduces its own noise spectrum to the system. A simpler, cheaper, tunable low-noise solid state microwave generator is desirable.

SUMMARY OF THE INVENTION

It is thus an object of the present invention to provide a solid state electric wave generator which is tunable over a given band of frequencies, and which will operate at noise levels low enough to be comparable to those of klystron and crystal-controlled solid state oscillators.

Additional objects are to provide such an electric wave generator which will operate at a given frequency in the tuning band with sufficient frequency stability that it may be coupled to a single stage high-order multiplier to provide a stable source of higher-frequency energy; to provide such a generator which can readily be temperature-compensated; and to provide in such a generator a transistor oscillator circuit in a configuration such that the basic oscillator frequency is essentially independent of the transistor parameters.

A more specific object is to provide a tunable L-Band oscillator which has sufficient frequency stability that when coupled to a high order multiplier it can provide a stable low-noise X-Band frequency source.

These and other objects of the invention are achieved in an electric wave generator combining a transistor oscillator with a passive resonator which is tunable over a given frequency band. The transistor is in an emitter-coupled common-collector oscillator circuit capable of generating electric wave energy in that frequency band, and is coupled via its emitter and collector across the resonator in shunt with a coupling capacitor having capacitance substantially larger than the series-resonance capacitance of the resonator circuit. The base electrode is inductively connected to the collector electrode. The passive resonator may be achieved in a cavity resonator which is both tunable and temperature compensated.

DESCRIPTION OF EMBODIMENTS

The following description of exemplary embodiments of the invention refers to the accompanying drawings, in which.

Figures 1, 2:
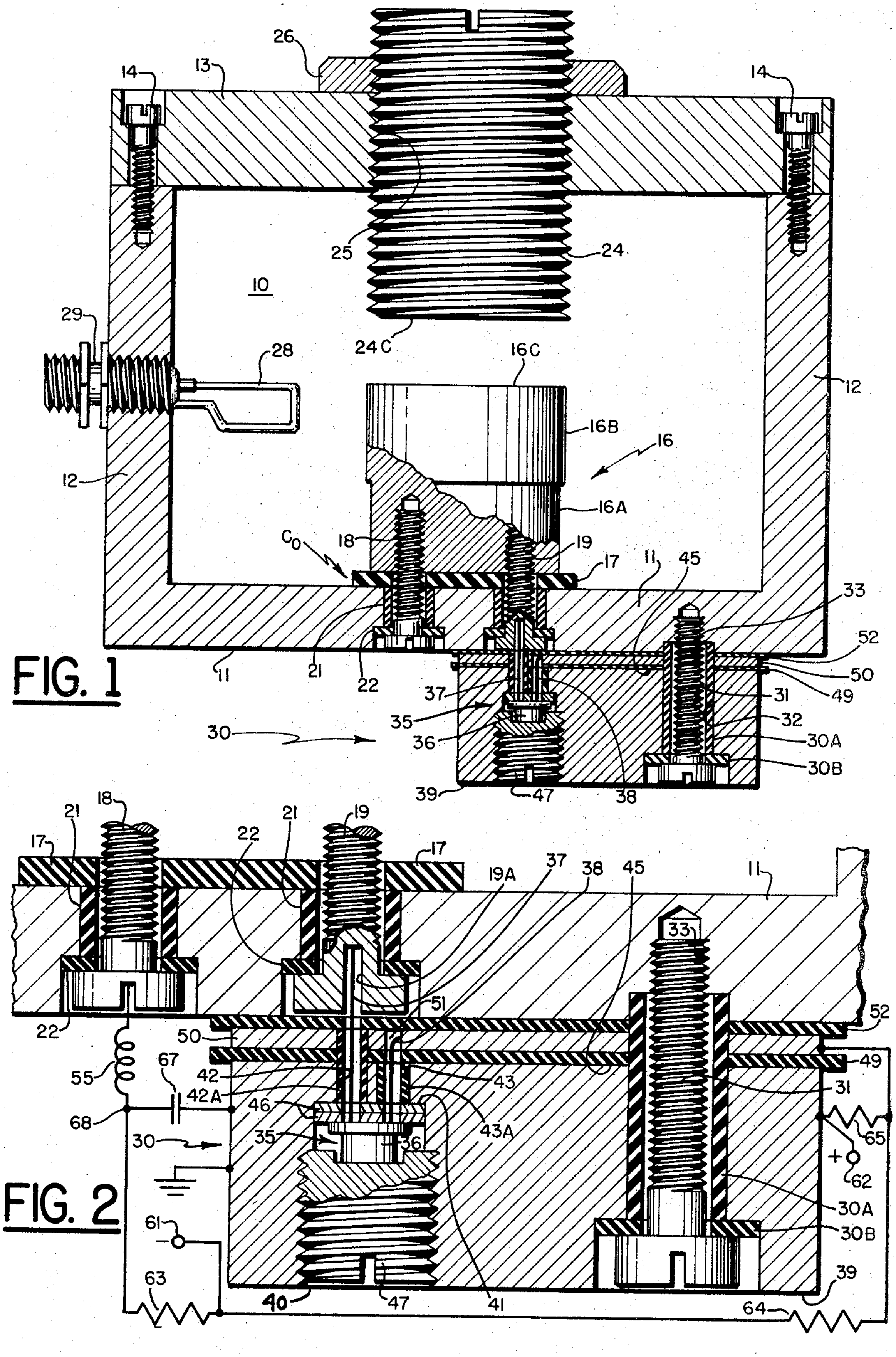
FIG. 1 is a vertical section through an embodiment of the invention.
FIG. 2 is an enlarged view of a portion of FIG. 1 with electrical circuit details added.

In FIG. 1, a cylindrical cavity generally designated 10 has a bottom wall 11 and cylindrical side wall 12, and a cover 13 attached to the top edge of the side wall by bolts 14. A cylindrical conductor 16 made in two sections 16A and 16B of different diameters, the latter section 16B having the larger diameter, is attached to the bottom wall 11 inside the cavity and on its cylinder axis, but insulated from the bottom wall by a dielectric sheet 17. The conductor 16 is held in place by two bolts 18 and 19 of electrically conductive material passing through the bottom wall 11 from outside the cavity 10 and insulated from the wall by dielectric sleeves 21 and washers 22. These bolts both make direct electrical contact with the conductor 16. A cylindrical externally-threaded tuning member 24 is mounted in a threaded bore 25 centrally located in the cover 13, so that its free end 24C confronts the conductor 16 axially and is movable toward and away from the free end 16C of the cylindrical conductor 16. A lock nut 26 is provided to secure the tuning member in a desired position. A coupling loop 28 for extracting energy from the cavity is fitted inside the cavity 10, at a coaxial fitting 29 which is threaded through the side wall 12.

A solid-state oscillator supported in a block, generally designated 30, is fitted to the outside of the bottom wall 11, by means of a bolt 31, which passes through a smooth bore 32 in the block 30 and threadedly engages a bore 33 in the bottom wall 11. The bolt 31 is insulated from the block 30 by a sleeve 30A in the bore 32 and a washer 30B under the head of the bolt, as is more clearly shown in the enlarged view of FIG. 2. The block 30 is thus electrically insulated from the cavity wall 11. The oscillator employs a transistor generally designated 35 having an electrically-conductive envelope 36 to which the collector electrode (not shown) is connected. An emitter electrode lead 37 and a base electrode lead 38 extend from the envelope 36 and are insulated from it.

The block 30, which functions as mounting means for the transistor 35, has a bore 40 extending from one surface 39 of the block part-way through it, in which the transistor is located; the bottom surface 41 of this bore is a platform surface for the transistor. Two smaller bores 42 and 43, respectively, each lined with an electrically insulating sleeve 42A and 43A respectively, extend from the platform surface 41 through the block to the opposite surface 45. The emitter electrode lead 37 passes through the first smaller bore 42 and the base electrode lead 38 passes through the second smaller bore 43. One or more washers or shims 46, appropriately apertured for passage of these electrodes, are provided between the transistor 35 and platform surface 41 to serve the purpose of establishing the length of the base electrode lead 38, for a use to be explained below. A cap screw 47 holds the transistor in place in its bore 40.

An electrically-conductive flat body 50 confronts the surface 45 of the block 30 to which the smaller bores 42 and 43 extend, being separated from it by a first sheet 49 of electrical insulator material. The base electrode lead 38 is connected directly to the flat body 50, in a bore 51 that registers with the bore 43 in the block 30. The flat body 50 thus serves the function of base-lead-contact conductor. It is insulated from the block 30 also by the sleeve 30A around the bolt 31. A second sheet 52 of electrical insulator material separates the base-lead-contact conductor 50 from the bottom wall 11 of the cavity 10. Bores in the insulator sheets 49 and 52 and conductor 50, registering with the bore 42 in the block 30 through which the emitter electrode lead 37 and sleeve insulator 42A pass accommodate these elements, and the emitter electrode lead 37 extends beyond the second insulator sheet 51 into the bolt 19 which holds the cylindrical conductor 16 of the cavity 10, to make direct electrical contact with the cylindrical conductor 16 through the bolt 19. For this purpose, a spring-like fitting (not shown, but which is commercially available) may be located in a bore 19A in the head of the bolt 19 and the free end of the emitter electrode lead 37 pushed into that fitting when the block 30 is fitted to the bottom wall 11 of the cavity 10.

Figure 3:
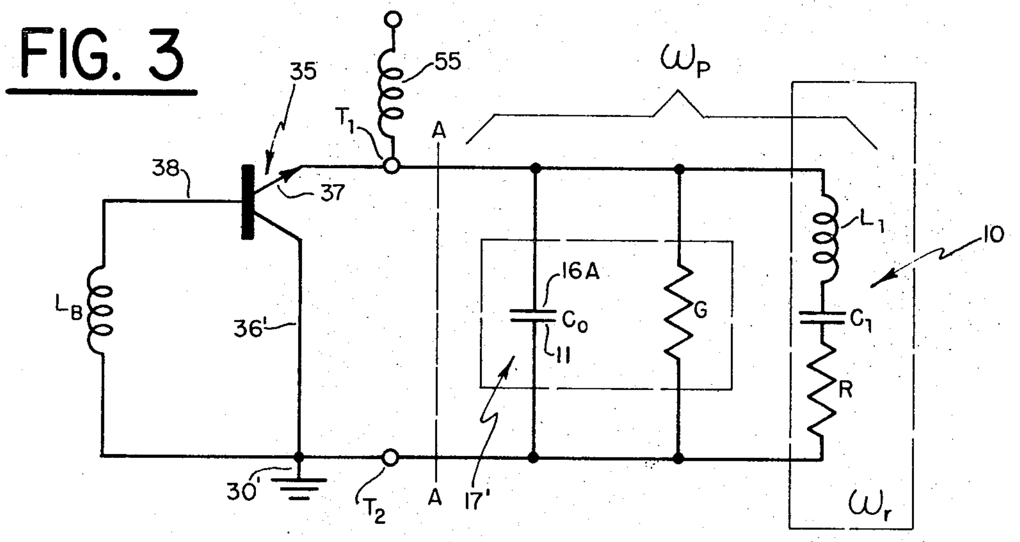
FIG. 3 is an equivalent electrical circuit of the oscillator in FIG. 1, without biasing voltages.

Referring now to FIG. 3, which represents the AC-equivalent oscillator circuit of FIG. 1, the cavity 10 is represented by inductance $L_1$, capacitance $C_1$ and resistance R in series in a dashed-line box; $\omega_r$ represents the cavity resonant frequency. The dielectric sheet 17 with the conductors 16A and 11 on either side of it constitutes a lossy capacitor 17′ having capacitance $C_0$ and conductance G in parallel, in another dashed-line box; $\omega_p$ represents the parallel resonance frequency of the three branches $C_0$, G and $L_1$–$C_1$–R across the terminals $T_1$ and $T_2$ shown at A—A. The transistor 35 has its base electrode 38 connected to a terminal 30, via the inductance $L_B$ of the base electrode lead 38. The collector lead 36′ is connected directly to this terminal 30′ (equivalent to the transistor envelope 36 in FIG. 1), and the emitter lead 37 is connected to one side of the capacitor $C_0$ (equivalent to the connection to conductor 16A via the bolt 19 in FIG. 1). The inductor 55 which is coupled at one end to terminal $T_1$ in parallel with the emitter lead 37 is useful in a DC biasing circuit, to be described below. Like the base electrode lead 38, the emitter electrode lead 37 has inductance, which is not illustrated.

With the block 30 insulated from the cavity wall 11 and the body 50, as shown, the DC connections can be floating above ground and either (+) connection or (−) connection can be grounded to the cavity wall 11 or not at all. If the washer 30B is omitted, the block 30 is connected to the cavity wall 11, and only the (+) side of the DC connection is grounded to the block 30 or cavity wall 11. The ground connection which is shown in the drawings is thus exemplary only. $C_1$ may have a value around 2 pico-farads. $C_0$ may have a value around 6 pf. for average noise and stability; around 25 to 60 pf. (approx.) for good noise and stability. When cavity losses are neglected, the circuit quality factor $Q_p$ of the equivalent circuit of FIG. 3 is given by the relation $$Q_p = Q_c \frac{C_0}{C_1} \qquad \text{Relation (1)}$$

where $$Q_c = \frac{\omega_p C_0}{G} = \text{quality factor of Capacitor } C_0$$

At resonance, $$\omega_r = \omega_p \qquad \text{Relation (2)}$$

when the condition of Relation 2 is met, the basic oscillator frequency is essentially independent of the transistor parameters.

In the transistor oscillator configuration shown, the oscillator output power is dependent upon the length of the base electrode lead 38. The length of this lead is adjusted to optimum empirically in FIG. 1 by means of the shims 46, after the distance between the platform surface 41 and the opposite surface 45 of the block 30 has been established. This arrangement provides an accurate and consistently repeatable base electrode lead length. The transistor oscillator configuration may be regarded as coupled to the cavity resonator at the terminals $T_1$ and $T_2$, which, from the standpoint of AC considerations, may be regarded as equivalent to the cylindrical conductor 16A and the block 30, respectively, in FIG. 1.

Figure 4:
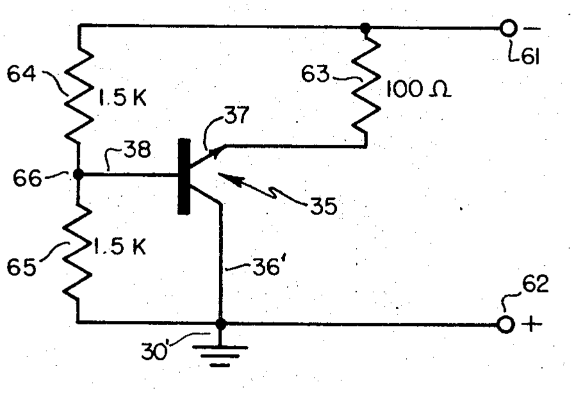
FIG. 4 is a bias-voltage schematic circuit for the transistor oscillator.

Comparatively large capacitances (around 200 pf.) which have been neglected in FIG. 3 (but which will be discussed in connection with FIG. 4A for the sake of completeness) are the series capacitance of insulator layers 49 and 52 between the cavity wall 11 and the block 30, and the capacitance of the first insulator layer 49, which is in series between $L_B$ and ground 30′. These are considered as almost short circuits, or very low impedance paths, for the operating frequency range; referring to FIG. 4A, they form an RF return path between $T_2'$ and 50′, and between 50′ and $T_2$ or 30′. A DC biasing circuit for the transistor 35 is shown in FIG. 4. A negative voltage is applied at a negative bias terminal 61; a positive bias is applied to the positive bias terminal 62. The negative terminal 61 is connected through a resistor 63 to the emitter lead 37 and through a voltage divider comprised of second and third resistors 64 and 65, respectively, to the positive terminal 62. The junction 66 of the voltage divider resistors is connected to the base lead 38, and the collector lead 36′ is connected to the positive terminal 62 (block 30). Bias-circuit resistors may have values as follows:

R63=100 ohms
R64; R65=1.5 kilohms each.

Transistor types may be Fairchild MT–1038; RCA–TA–2710. Bias voltage may be 13.5 volts (approx.) between collector and emitter electrodes.

The DC bias circuit resistors 63, 64 and 65, and bias voltage terminals 61 and 62, are indicated also in FIG. 2, where their actual connections into a working embodiment of the invention are shown. In practice an RF choke 55 (about 10 $\mu$h.) is interposed between the emitter resistor 63 and the emitter 37, to which a direct connection is conveniently made via the accessible bolt 18 holding the cylindrical conductor 16. The choke may, for example, be about 10 turns of No. 28 wire in a coil of 0.046 inch diameter in air. An RF by-pass capacitor 67 (about 0.001 $\mu$f.) is connected between the junction 68 of the emitter resistor 63 and choke 55, and the block 30.

Figure 4A:
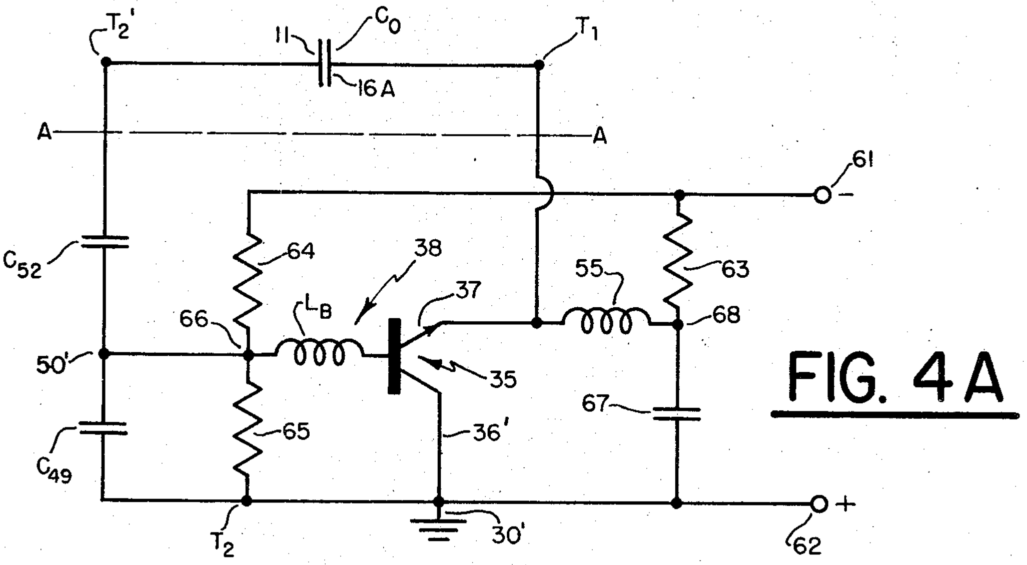
FIG. 4A is a schematic circuit showing the AC oscillator and DC bias circuits of the transistor oscillator.

A schematic of the combined DC biasing and AC oscillator circuits of the transistor 35 is shown in FIG. 4A, where the components are labelled with the same reference characters as in the figures discussed earlier. This figure shows the capacitors $C_{49}$ and $C_{52}$ which are attributable to the first and second sheets 49 and 52 of electrical insulator material, located on either side of the base lead contact conductor 50, which is represented in FIG. 4A by a terminal 50′ between these two capacitors. The base electrode lead 38, comprising the inductance $L_B$ in series with the base electrode, is connected to this terminal 50′, which is also connected directly to the junction 66 between the voltage divider resistors 64 and 65. Shown also in FIG. 4A are the RF choke 55 and by-pass capacitor 67, connected in series between the emitter lead 37 and terminal 30′, with the emitter resistor 63 connected from their common junction 68 to the negative bias terminal 61. The terminals $T_1$ and $T_2$ between the transistor configuration and the cavity 10 are actually located respectively at the emitter lead 37 and block 30; however, recalling that the capacitors $C_{49}$ and $C_{52}$ are relatively large, constituting in effect merely an RF return path, the second terminal $T_2$ may be regarded effectively to be at the bottom wall 11 of the cavity, indicated as $T_2'$ in FIG. 4A. For this reason the boundary A—A is drawn at $T_1$–$T_2'$ in FIG. 4A.

Several L-band oscillators, as described above, operating in the 1.6 gHz. range have been built. In one example, the transistor employed was Fairchild NPN type MT–1038. In the transistor configuration, the base electrode lead length was about 150 mils (0.150 inch). The cavity 10 was three inches in diameter, and its components were made of Invar, to enhance temperature stability, and silver plated. The air gap between the confronting surfaces 16C and 24C of the cylindrical conductor 16 and tuning member 24 was about 0.500 inch, and the dielectric sheet 17 was mica about 44 mils (0.044 inch thick. The diameter of the center conductor was in the range of 1.0 inch, the thicker part 16B being about 1.050 inch and the thinner part 16A about 0.950 inch. The diameter of the tuning member 24 was about 1.0 inch. The total voltage ($V_T$) across the DC supply (not shown), measured at the bias terminals 61 and 62, was 25 volts, and the total current ($I_T$) drawn from the supply was about 90 milliamperes (block 30) and emitter 37 was tween the collector 36' (block 30) and emitter 37 was about 13.5 volts DC. The RF oscillator frequency ($f_0$) was 165 gHz., and the RF power ($P_0$) at this frequency was about 70 milliwatts (mw.).

Several additional examples of this embodiment of the invention were built, using the same cavity and transistor type, with variations in the thickness (A) of the dielectric sheet 17 and length (L) of the base lead 38. Following is a tabulation of the DC operating parameters and RF oscillation output obtained in each case:

TABLE I

| A, inches | L, inches | $V_T$, volts DC | $I_T$, ma. | $f_0$, gHz. | $P_0$, mw. |
|---|---|---|---|---|---|
| 0.044 | 0.140 | 25 | 98 | 1.65 | 77 |
| 0.044 | 0.140 | 22.5 | 85 | 1.65 | 65 |
| 0.085 | 0.140 | 25 | 98 | 1.65 | 78 |
| 0.085 | 0.140 | 22.5 | 88 | 1.65 | 68 |
| 0.030 | 0.140 | 25 | 98 | 1.65 | 64 |
| 0.030 | 0.140 | 22.5 | 86 | 1.65 | 51 |
| 0.044 | 0.130 | 25 | 98 | 1.65 | 70 |
| 0.044 | 0.130 | 22.5 | 88 | 1.65 | 58 |
| 0.044 | 0.160 | 25 | 98 | 1.65 | 105 |
| 0.044 | 0.160 | 22.5 | 87 | 1.65 | 85 |
| 0.044 | 0.175 | 25 | 98 | 1.65 | 110 |
| 0.044 | 0.175 | 22.5 | 86 | 1.65 | 90 |
| 0.044 | 0.200 | 25 | 98 | 1.65 | 170 |
| 0.044 | 0.200 | 22.5 | 86 | 1.65 | 150 |

Another run of data was taken using the same 3-inch cavity 10, but varying the tuning over a range from 1.50 to 1.70 gHz., while holding the following operating parameters:

$V_T$=25 volts DC; $V_{CE}$=13.5 volts DC;
$I_T$=98 ma.; A=0.044 inch; L=0.200 inch.

The results were:

| $f_0$ gHz. | $P_0$ Mw. |
|---|---|
| 1.50 | 100 |
| 1.55 | 152 |
| 1.60 | 174 |
| 1.65 | 170 |
| 1.67 | 150 |
| 1.70 | 125 |

Figure 5:
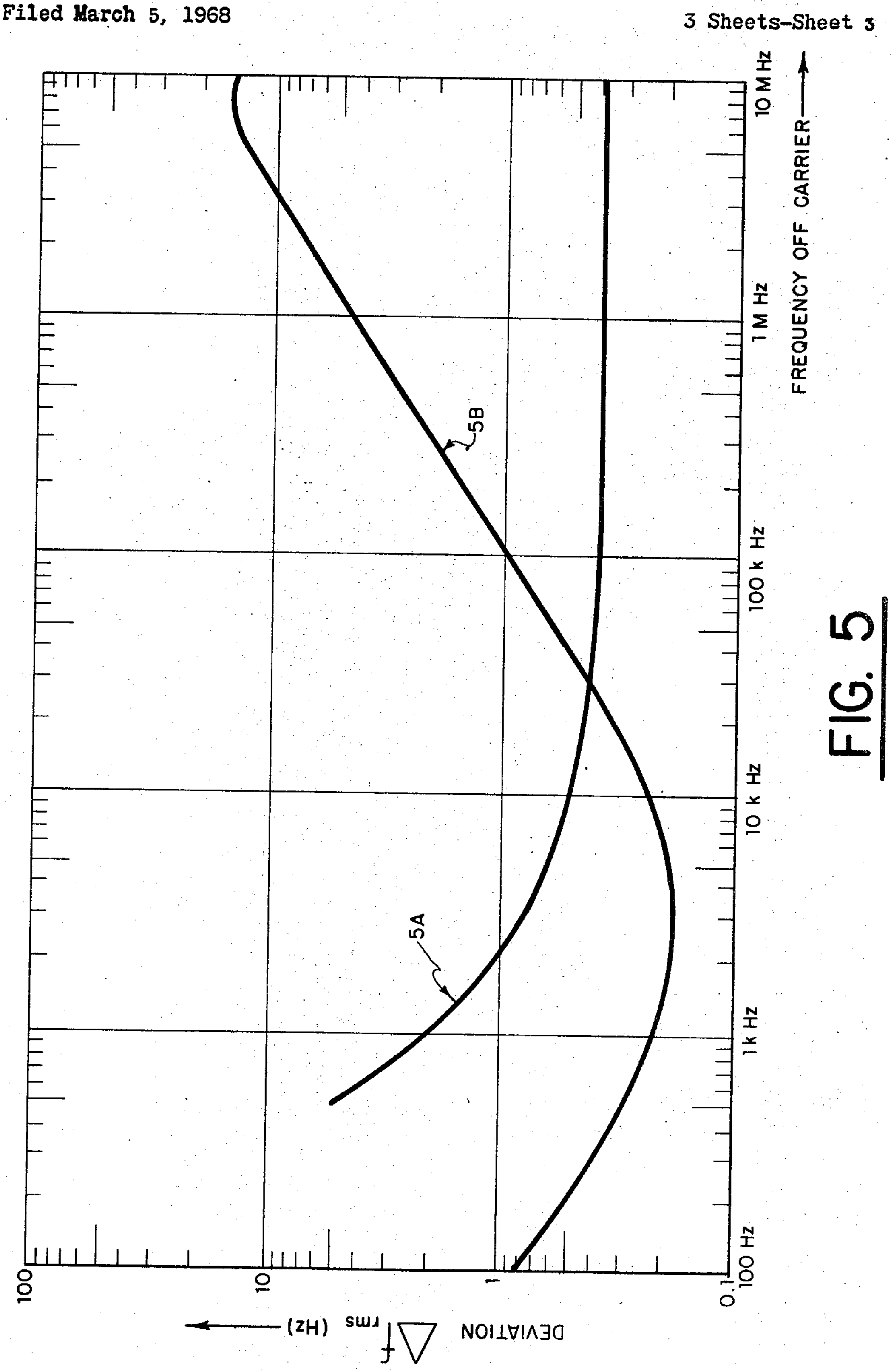
FIG. 5 is a set of graphs comparing the present invention and the pior art with respect to effective noise introduced into an FM transmitter due to inherent noisiness of the signal or local oscillator.

In order to obtain a rough comparison of FM noise between a solid-state RF source employing the tunable oscillator of the invention, and a prior solid-state RF source employing amplifiers and several stages of harmonic generators, an L-band oscillator according to the invention tuned to 1.60 gHz. was coupled through an L-band isolator to a single-stage X7 solid-state multiplier, the output of which was passed through a five-section Tchebycheff filter which was tuned to a center frequency of 11.2 gHz. and exhibited ±0.1 db ripple and an insertion loss of 0.5 db in the ±600 mHz. bandpass. The FM noise spectrum of this combination is compared in FIG. 5 with the FM noise spectrum of a typical low-noise crystal-controlled oscillator-amplifier varactor multiplier X-Band source. These curves show the effective noise introduced into an FM transmitter due to inherent noisiness of the X-band source, referred to a 100 Hz. bandwidth in one sideband. The frequency off carrier is plotted along abscissa, while the frequency deviation ($\Delta f_{RMS}$) is plotted along the ordinate, both dimensions being logarithmic. Curve 5A represents the noise spectrum of the combination of the cavity oscillator of the invention and the single-stage X7 multiplier. As the frequency off carrier approaches frequencies used in the communication bands (>about 20 kHz.) the FM RMS deviation becomes small (<about 0.5 Hz.) and remains small throughout a wide range extending to and beyond 10 mHz. off carrier. At lower frequencies off carrier (<about 10–20 kHz.) the crystal-controlled oscillator-amplifier-varactor multiplier multi-stage harmonic generator exhibits lower deviations, as is apparent from curve 5B, but even here phase-locking techniques which are known to the art will allow the lower end of curve 5A to be made comparable to the lower end of curve 5B. In the range above about 20 kHz. curve 5A indicates obvious superiority for the cavity oscillator of the invention in combination with a single-stage high-order multiplier. Moreover, the FM RMS deviation of the latter combination was less than 1.0 Hz. in any 100 Hz. bandwidth at frequencies greater than 2.5 kHz. removed from the carrier; this combination provided X-band output power of 12 mw., as compared with 20 mw. provided by the multi-stage multiplier with crystal-controlled oscillator-amplifier stages.

Embodiments of the invention were made using a cavity 10 having a diameter of two inches. An L-band oscillator, operating nominally at 1.6 gHz., was designed using a two-inch diameter aluminum cavity. The transistor used was RCA type TA–2710, chosen because of its improved low temperature performance and higher power capabilities, an option which is not material to the operability of the invention, but does serve to illustrate that a choice of transistors is available to the designer seeking to use the invention. The center conductor 16 was Invar, top-loaded with a larger-diameter portion 16B to enhance temperature compensation of the cavity 10. In an example of this embodiment using an air gap of 0.025 inch between the center conductor face 16C and confronting tuning member face 24C, $C_0$ was computed to be 6.2 pf. With $V_T$=24 volts and $I_T$=95 ma., power output at L band, with the cavity uncompensated, was in the range from 200 to 250 milliwatts (mw.) as the frequency was varied from 1.5 to 1.6 gHz., being highest at about 1.52 gHz. The measured FM noise spectrum at X-band when combined with an X7 multiplier showed FM RMS deviation about 8.0 Hz. at 1 kHz. off carrier (10.8 gHz.), reducing to 1.25 Hz. at 100 kHz. off carrier. However, a study of noise reduction as a function of $C_0$ showed that an increase of $C_0$ produces a reduction in noise. As $C_0$ was increased the noise deviation spectra decreased; data tabulated in Table II following illustrate the findings:

TABLE II

| $C_0$ (pf) | $P_{osc}$ (L-band) (mw.) | $P_{out}$ (X-band) (mw.) | FM RMS deviaticn between 1 kHz. and 100 kHz. off carrier (Hz.) (Approx.) |
|---|---|---|---|
| 6.2 | 280 | 28 | 8.0–1.25 |
| 26.0 | 200 | 22 | 1.25–0.3 |
| 36.0 | 150 | 19 | 0.9–0.20 |
| 61.0 | 100 | 11 | 0.40–0.15 |
| 46.0 | 120 | 15 | 0.65–0.15 |

The lower-deviation was able to be extended throughout the range 10 kHz. to 100 kHz. off carrier by properly adjusting the external DC bias applied to the varactor diode used in the X7 multiplier. A further check out to 1.5 mHz. off carrier revealed that the noise continued to decrease and was below the measuring capability of the noise measuring equipment being used.

As $C_0$ is increased $Q_L$ also increases. As $Q_L$ increases, the mechanical tuning range of the cavity 10 decreases, and the coupling tends to become critical. The last entry in Table II represents a compromise value of $C_0$ in regard to noise and tuning, for the example described.

With optimization of the length of the base lead 38 and the magnitude of $C_0$, the invention can exhibit FM noise deviation spectra, at least for the three-inch diameter cavity oscillator, which will be as low as a low noise stabilized klystron oscillator which is presently available. The best low-noise klystron presently known to us has a noise of 0.025 Hz. at 1 kHz. and 0.012 at 100 kHz., costs about $15,000 and requires a power supply costing about $5,000.

The embodiments of the invention which have been illustrated and described herein are but a few illustrations of the invention. Other alternative circuit arrangements may be made within the scope of this invention by those skilled in the art. No attempt has been made to illustrate all possible embodiments of the invention, but rather only to illustrate its principles and the best manner presently known to practice it. Therefore, while certain specific embodiments have been described as illustrative of the invention, such other forms as would occur to one skilled in this art on a reading of the foregoing specification are also within the spirit and scope of the invention.

We claim:

1. An electric wave generator comprising, in combination a transistor having base, collector and emitter electrodes in an emitter-coupled common-collector oscillator circuit capable of generating electric wave energy in a prescribed band of frequencies, passive-resonator circuit means capable of being tuned over a portion of said band and tuning means associated therewith, means including a coupling capacitor having capacitance substantially larger than the series-resonance capacitance of said resonator circuit for coupling said oscillator circuit to said resonator circuit in a configuration presenting said coupling capacitor in shunt with said resonator circuit across said collector and emitter electrodes, an inductive connection between said base and collector electrodes, and means to extract generated electric wave energy from said passive resonator circuit means.

2. A generator according to claim 1 in which said base and collector electrodes are coupled in said oscillator circuit via inductance attributable substantially exclusively to the length of the base electrode lead.

3. A generator according to claim 2 including mounting means for said transistor having means to establish the length of said base electrode lead.

4. A generator according to claim 3 in which said transistor has an envelope from a portion of which said base electrode lead extends, and said mounting means includes a member having a platform surface for receiving said envelope, and a second surface spaced from said platform surface, a bore through said member from said platform surface to said second surface for passage of said base electrode lead, said bore serving to establish the useful length of said base electrode lead when said envelope is mounted to said mounting means with said portion confronting said platform surface and said base electrode lead passing through said bore.

5. A generator according to claim 4 in which said transistor envelope is made of an electrically-conductive material and is electrically connected to said collector electrode, said mounting means is made of an electrically conductive material and is electrically connected to said transistor envelope, and electrical insulator material is provided to D.C. insulate said base electrode lead from said mounting means.

6. A generator according to claim 5 including a first electrical insulator on said second surface and a base-lead-contact conductor confronting said second surface separated therefrom by said first insulator, the free end of said base electrode lead being connected to said base-lead-contact conductor.

7. A generator according to claim 6 in which said transistor has an emitter electrode lead extending from said envelope, a bore is provided in said mounting means member and bores are provided in said first insulator and said base-lead-contact conductor for passage therethrough of said emitter electrode lead, said emitter electrode being provided with electrical insulator material to D.C. insulate same from said mounting means members and said base-lead-contact conductor, said emitter electrode lead protruding from said base-lead-contact conductor for making direct electrical contact to an element of said passive resonator circuit.

8. A generator according to claim 1 in which said emitter electrode is directly electrically connected to an element of said passive resonator circuit means.

9. A generator according to claim 1 in which said passive resonator circuit means comprises a resonator envelope of electrically conductive material bounding a resonator chamber, internal electric conductor means in said chamber, and means for tuning said resonator circuit.

10. A generator according to claim 9 in which said internal electric conductor means is insulated at one end from said resonator envelope by a dielectric member, and said oscillator circuit is coupled to said resonator circuit at said internal electric conductor means and said resonator envelope so that said dielectric member provides the dielectric of said coupling capacitor.

11. A generator according to claim 10 in which said emitter electrode is directly electrically connected to said internal electric conductor means.

12. A generator according to claim 11 in which said base and collector electrodes are coupled in said oscillator circuit via inductance attributable substantially exclusively to the length of the base electrode lead, and said collector electrode is coupled to said resonant envelope via bypass capacitor means having capacitance which is large compared to the capacitance of said coupling capacitor.

13. A generator according to claim 7 in which said passive resonator circuit means comprises a resonator envelope of electrically conductive material bounding a resonator chamber, internal electric conductor means in said chamber, and means for tuning said resonator circuit, and including a second electrical insulator on an outer surface of said resonator envelope, said base-lead-contact conductor confronting said outer surface and being separated therefrom by said second electrical insulator, a bore in said second electrical insulator, said emitter electrode lead being directly connected to said internal electric conductor means through said last-named bore, the assembly of said mounting means, first electrical insulator, base-lead-contact conductor, second electrical insulator and resonator envelope constituting RF bypass capacitor means for coupling said collector electrode to said resonator envelope.

14. A generator according to claim 1 comprising bias-voltage terminal means, a resistance voltage divider connected at its ends to said terminal means, said emitter electrode being connected to one of said terminal means, said collector electrode being connected to another of said terminal means, and said base electrode being connected via said inductive connection to an intermediate point of said voltage divider.

15. A generator according to claim 14 including a second inductive connection between said emitter electrode and said one of said terminal means, the junction of said emitter electrode and said second inductive connection being connected to one side of said coupling capacitor.

16. A generator according to claim 13 comprising bias-voltage terminal means, a connection between one of said terminal means and said mounting member, a first resistor connected between said mounting member and said base-lead-contact conductor, a second resistor connected between said base-lead-contact conductor and a second of said terminal means, and a connection between said second terminal means and said internal conductor.

17. An electric oscillator circuit comprising a transistor having base, collector and emitter electrodes in an emitter-coupled common-collector oscillator circuit, an essentially inductive connection between said base and collector electrodes, the inductance of said connection being attributable substantially exclusively to the length of the base electrode lead, in which said transistor has an electrically conductive envelope from a portion of which said base and emitter electrode leads extend and to which said collector electrode is connected, and including an electrically conductive mounting member for said envelope, said mounting member having a platform surface fro receiving said envelope, and a second surface spaced from said platform surface, bore means through said member from said platform surface to said second surface for passage of said base and emitter electrode leads, said bore serving to establish said length of said base electrode lead when said envelope is mounted to said mounting member with said portion confronting said platform surface and said base electrode lead passing through said bore means, base-lead terminal means closely adjacent said second surface, and means to attach said base electrode lead to said base-lead terminal means, said emitter electrode lead extending through said mounting member for connection to a load for said circuit.

18. An oscillator circuit according to claim 17 including a plurality of bias-voltage terminal means, a connection between one of said bias-voltage terminal means and said mounting member, a first resistor connected between said mounting member and said base-lead terminal means, a second resistor connected between said base-lead terminal means and a second of said bias-voltage terminal means, and a connection between said second bias-voltage terminal means and said emitter electrode.

References Cited

UNITED STATES PATENTS

| | | | |
|---|---|---|---|
| 3,343,103 | 9/1967 | Schoniger | 331—97 |
| 3,349,341 | 10/1967 | Schoniger | 331—117 |
| 3,427,544 | 2/1969 | Wolfram | 331—99 X |

ROY LAKE, Primary Examiner

S. H. GRIMM, Assistant Examiner

U.S. Cl. X.R.

331—117; 333—83